(12) United States Patent
Wang et al.

(10) Patent No.: US 12,405,236 B1
(45) Date of Patent: Sep. 2, 2025

(54) METHOD FOR MEASURING CRITICAL CONDENSATE SATURATION PRESSURE AND CRITICAL CONDENSATE SATURATION OF CONDENSATE GAS BY COMBINING ONE-DIMENSIONAL AND TWO-DIMENSIONAL NUCLEAR MAGNETIC RESONANCE TECHNIQUES

(71) Applicant: Southwest Petroleum University, Chengdu (CN)

(72) Inventors: Shuoshi Wang, Chengdu (CN); Limiao Wang, Chengdu (CN); Ping Guo, Chengdu (CN); Zhouhua Wang, Chengdu (CN); Ruifeng Xu, Chengdu (CN); Gan Peng, Chengdu (CN); Yisheng Hu, Chengdu (CN); Huang Liu, Chengdu (CN); Hanmin Tu, Chengdu (CN)

(73) Assignee: Southwest Petroleum University, Chengdu (CN)

( * ) Notice: Subject to any disclaimer, the term of this patent is extended or adjusted under 35 U.S.C. 154(b) by 0 days.

(21) Appl. No.: 19/174,775

(22) Filed: Apr. 9, 2025

(30) Foreign Application Priority Data

Nov. 14, 2024 (CN) .......................... 202411620836.1

(51) Int. Cl.
*G01N 24/08* (2006.01)
*G01R 33/50* (2006.01)

(52) U.S. Cl.
CPC ......... *G01N 24/081* (2013.01); *G01N 24/082* (2013.01); *G01R 33/50* (2013.01)

(58) Field of Classification Search
CPC .... G01N 24/081; G01N 24/082; G01R 33/50; G01R 33/448; G01R 33/5608; G01R 33/305
See application file for complete search history.

(56) References Cited

U.S. PATENT DOCUMENTS

2014/0285196 A1   9/2014   Liu
2015/0177351 A1   6/2015   Venkataramanan
(Continued)

FOREIGN PATENT DOCUMENTS

CN    115266800 A    11/2022
CN    116953012 B    10/2023
(Continued)

OTHER PUBLICATIONS

Wang Meng, Application of 1D and 2D Nuclear Magnetism Logging to Assessment of Low Permeability Reservoir in the East China Sea Basin Offshore Oil, Mar. 22, 2017(Mar. 22, 2017), pp. 79-83.
(Continued)

*Primary Examiner* — Rishi R Patel
(74) *Attorney, Agent, or Firm* — Birchwood IP

(57) ABSTRACT

Disclosed is a method for measuring critical condensate saturation pressure and critical condensate saturation of condensate gas by combining one-dimensional and two-dimensional nuclear magnetic resonance techniques, which solves low measurement precision and complex test method. The present invention detects signal intensity of the hydrogen-containing fluid in a rock core by combining a one-dimensional nuclear magnetic resonance $T_2$ spectrum testing technology and a two-dimensional nuclear magnetic resonance $T_1$-$T_2$ spectrum testing technology, achieves the optimization of an artificial zoning method by an improved difference spectroscopy method to reduce errors, greatly improves condensate signal identification precision, and more quickly and accurately measures the critical condensate saturation pressure and the critical condensate saturation. Therefore, the flow law of condensate oil and gas two-phases in a formation is better studied, a more reasonable development plan is favorably formulated by a gas
(Continued)

reservoir, and theoretical guidance is provided for improving condensate recovery ratio.

6 Claims, 5 Drawing Sheets

(56) References Cited

U.S. PATENT DOCUMENTS

| | | |
|---|---|---|
| 2018/0202264 A1 | 7/2018 | Sarduy |
| 2022/0082517 A1* | 3/2022 | Song .................. G01R 33/305 |
| 2024/0027379 A1 | 1/2024 | Fu |

FOREIGN PATENT DOCUMENTS

| | | |
|---|---|---|
| CN | 17110352 B | 11/2023 |
| CN | 117233064 B | 12/2023 |
| CN | 117269223 B | 12/2023 |
| CN | 118777358 A | 10/2024 |

OTHER PUBLICATIONS

Shuoshi Wang, Comparative Laboratory Wettability Study of Sandstone, Tuff, and Shale Using 12-MHz NMR T1-T2 Fluid Typing: Insight of Shale, SPE Journal, Sep. 30, 2024(Sep. 30, 2024), pp. 4781-4803.

Yan Weilin, New evaluating method of oil saturation in Gulong shale based on NMR technique, Petroleum Geology & Oilfield Development in Daqing, Oct. 31, 2021(Oct. 31, 2021), pp. 78-86.

* cited by examiner

METHOD FOR MEASURING CRITICAL CONDENSATE SATURATION PRESSURE AND CRITICAL CONDENSATE SATURATION OF CONDENSATE GAS BY COMBINING ONE-DIMENSIONAL AND TWO-DIMENSIONAL NUCLEAR MAGNETIC RESONANCE TECHNIQUES

CROSS-REFERENCE TO RELATED APPLICATIONS

This application claims priority to Chinese Patent Application No. 202411620836.1, filed on Nov. 14, 2024, which is hereby incorporated by reference in its entirety.

TECHNICAL FIELD

The present invention belongs to the technical field of oil and gas reservoir development, and specifically relates to a method for measuring critical condensate saturation pressure and critical condensate saturation of condensate gas.

BACKGROUND

A condensate gas reservoir has huge geological reserves and high economic value, and plays a key role in the exploration and utilization of global oil and gas resources. The condensate gas reservoir has oil-gas dual characteristics and complex phase changes. When the formation pressure drops below the dew point pressure, condensate gas undergoes retrograde condensation, causing heavy components to precipitate into liquid phase and forming gas-liquid two-phases. Only when the formation pressure is depleted to the critical condensate saturation pressure, that is, when the condensate saturation reaches the critical condensate saturation, the condensate oil starts to flow. Therefore, the critical condensate saturation is an important parameter reflecting the flow capacity of condensate oil. The determination of critical condensate saturation pressure and critical condensate saturation is necessary to design a more reasonable development plan for a condensate gas reservoir and thus provides theoretical guidance for improving condensate recovery rate. Therefore, how to determine the critical condensate saturation pressure and the critical condensate saturation has always been a hot issue in the development and research of condensate gas reservoirs worldwide.

Currently, one-dimensional nuclear magnetic resonance difference spectroscopy has been widely used, mainly for porosity or irreducible phase occupied porosity determination, but does not have fluid identification capability. The present invention adopts two-dimensional nuclear magnetic resonance difference spectroscopy to achieve oil and gas signal differentiation. At present, there are few studies on two-dimensional nuclear magnetic resonance difference spectroscopy. The existing patents for two-dimensional nuclear magnetic resonance difference spectroscopy are as follows: "METHOD FOR CALIBRATING TWO-DIMENSIONAL NUCLEAR MAGNETIC RESONANCE DISTRIBUTION OF FRACTURES IN CARBONATE LIGHT OIL RESERVOIRS" (CN116953012A), "METHOD FOR CALIBRATING TWO-DIMENSIONAL NUCLEAR MAGNETIC RESONANCE $T_1$-$T_2$ DISTRIBUTION OF FRACTURES IN SHALE MEDIUM OIL RESERVOIRS" (CN117110352B), and "METHOD FOR CALIBRATING TWO-DIMENSIONAL NUCLEAR MAGNETIC RESONANCE $T_1$-$T_2$ DISTRIBUTION OF MULTI-SCALE FRACTURES IN LAMINATED SHALE" (CN117269223A). According to these three patents, two-dimensional nuclear magnetic resonance scanning experiments are performed on oil-saturated rock samples and gas-flooded rock samples to obtain the corresponding overall two-dimensional nuclear magnetic resonance $T_1$-$T_2$ spectrum of pores and fractures and two-dimensional nuclear magnetic resonance $T_1$-$T_2$ spectrum of matrix pores, then the two-dimensional nuclear magnetic resonance $T_1$-$T_2$ spectrum of fractures is obtained based on difference spectroscopy, and finally cross calibration is performed on a fracture pore size histogram obtained by CT to obtain a graph of two-dimensional nuclear magnetic resonance fractures and matrix porosity distribution. The improved two-dimensional nuclear magnetic resonance difference spectroscopy method adopted by the present invention obtains the baseline and two-dimensional spectra in different saturation states by a targeted calibration method, and processes two-dimensional nuclear magnetic resonance $T_1$-$T_2$ spectrum by the improved difference spectroscopy, thereby accurately measuring the condensate saturation at different pressures. It may be seen that there are essential differences between the two methods.

The present invention proposes to use improved novel two-dimensional nuclear magnetic resonance difference spectroscopy to identify and measure condensate oil. However, in the existing patent "CONDENSATE SATURATION TEST METHOD BASED ON TWO-DIMENSIONAL NUCLEAR MAGNETIC RESONANCE" (CN115266800A), oil and gas are identified and condensate saturation is measured using an artificial zoning method, which has the following disadvantages: in divided zones, oil signals in oil zones are dominant, and gas signals in gas zones are dominant, but the gas signals appear in the oil zones, and vice versa. Therefore, the artificial division of oil-gas areas leads to inaccurate measurement and deviation in the measured condensate saturation. The improved two-dimensional nuclear magnetic resonance difference spectroscopy method adopted by the present invention is an improvement on the artificial zoning method, avoids errors caused by artificial signal zoning, and can more accurately measure the condensate saturation.

Through the combination and verification between a one-dimensional nuclear magnetic resonance testing method and a two-dimensional nuclear magnetic resonance testing method, the present invention can accurately measure a rate at which hydrogen-containing substances leave a core, precisely determine the critical condensate saturation pressure, and accurately determine the critical condensate saturation by combining the condensate saturation obtained by the novel two-dimensional nuclear magnetic resonance difference spectroscopy. According to the patent "METHOD FOR TESTING CONDENSATE SATURATION BASED ON TWO-DIMENSIONAL NUCLEAR MAGNETIC RESONANCE" (CN115266800A), the condensate saturation can be identified within a certain error range, but the critical condensate saturation pressure and critical condensate saturation cannot be identified. Some scholars also directly observe a first drop of oil flowing out of the rock core and determine critical saturation pressure by using a long rock core experimental device with a high-temperature and high-pressure observation window, and then reversely infer the critical condensate saturation in the rock core under this pressure by analyzing the changes in the produced material components with a chromatograph and combining a material balance equation and a phase equilibrium equation (Tang Yong, Sun Lei. Experimental Determination Method of Critical Condensate Saturation Using Long Core Flooding [J]. Natural Gas Industry, 2006, 26(7): 100-102). This method is an indirect measurement method with errors. The present invention measures a rate at which hydrogen-containing fluid leaves a porous medium by combining one-dimensional and two-dimensional nuclear magnetic resonance signals, and achieves the direct measurement of the critical condensate saturation pressure during the condensate gas depletion process, which greatly improves the test precision of the critical condensate saturation pressure compared to the existing indirect calculation method. The condensate saturation is accurately measured by adopting the improved two-dimensional nuclear magnetic resonance difference spectroscopy method, the two-dimensional nuclear magnetic resonance $T_1$-$T_2$ spectrum calibration is completed by experimental design, subtraction or addition of gas signals in the oil zones and oil signals in the gas zones is achieved, the traditional artificial zoning method for identifying oil and gas is improved, the condensate signal identification precision is greatly improved, and the condensate saturation is accurately measured. With the combination of the critical condensate saturation pressure identification and the condensate saturation measurement, more representative critical condensate saturation is obtained.

SUMMARY

The purpose of this section is to summarize some aspects of embodiments of the present invention and to briefly introduce some preferred embodiments. Some simplifications or omissions may be made in this section and the abstract and title of the present application to avoid obscuring the purpose of this section, the abstract and the title. Such simplifications or omissions shall not be used to limit the scope of the present invention.

The present invention provides a method for measuring critical condensate saturation pressure and critical condensate saturation of condensate gas based on a nuclear magnetic resonance technology. This method combines a one-dimensional nuclear magnetic resonance $T_2$ testing technology and a two-dimensional nuclear magnetic resonance $T_1$-$T_2$ testing technology. The principle of this method is as follows: an occasion at which condensate oil starts to flow is judged by using changes of the total signal intensity of the fluid inside the rock core during the depletion process, the nuclear magnetic resonance may detect the signal intensity of hydrogen-containing fluid inside the rock core, since the hydrogen index of the condensate oil is far higher than that of the condensate gas, when the condensate oil starts to flow out of the rock core in a liquid phase form, the rate of decrease of the total signal intensity of the fluid inside the rock core is significantly increased, and the sudden drop point of the signal intensity represents that the condensate oil in the rock core starts to continuously flow under the pressure; the critical condensate saturation pressure is determined by measuring the sudden drop point of the signal intensity through the nuclear magnetic resonance, and then the critical condensate saturation corresponding to the critical condensate saturation pressure may be calculated by combining an improved difference spectroscopy method, which avoids the inaccurate measurement caused by artificial division of oil-gas zones and the deviation of the measured condensate saturation. The improved two-dimensional nuclear magnetic resonance difference spectroscopy method adopted by the present invention is an improvement on the artificial zoning, avoids errors caused by artificial signal zoning, and can more accurately measure the condensate saturation.

To achieve the above technical objective, the present invention adopts the following technical solution, which includes the following steps:

step S1: performing calibration experiment on condensate signal intensity and condensate saturation to obtain a relationship curve between the signal intensity and the saturation;

step S2: performing depletion experiment on the rock core, and acquiring a one-dimensional nuclear magnetic resonance $T_2$ spectrum and a two-dimensional nuclear magnetic resonance $T_1$-$T_2$ spectrum at each pressure point;

step S3: calculating the condensate saturation by using an improved difference spectroscopy method through original data of the two-dimensional nuclear magnetic resonance $T_1$-$T_2$ spectrum obtained in the step S2;

step S4: plotting a relationship curve between total signal intensity and pressure by total signal intensity of the one-dimensional nuclear magnetic resonance $T_2$ spectrum and total signal intensity of the two-dimensional nuclear magnetic resonance $T_1$-$T_2$ spectrum obtained in the depletion experiment, and obtaining a pressure point corresponding to a sudden drop point of the curve, wherein the pressure point is a critical condensate saturation pressure point; then calculating critical condensate saturation corresponding to the critical condensate saturation pressure according to a relationship curve between pressure and condensate saturation obtained by an improved difference spectroscopy method; wherein the improved difference spectroscopy method achieves subtraction or addition of gas signals in oil zones and oil signals in gas zones, optimizes the traditional artificial zoning for identifying oil and gas, greatly improves the precision of condensate signal identification, and accurately measures condensate saturation; and step S5: verifying the reliability of the critical condensate saturation pressure and the critical condensate saturation by adopting a long rock core depletion experiment and numerical simulation.

In a preferred solution of the method for measuring critical condensate saturation pressure and critical condensate saturation of condensate gas by combining one-dimensional and two-dimensional nuclear magnetic resonance techniques according to the present invention, the step S1 includes the following specific operation processes:

step S1.1: cleaning and drying a rock core;

step S1.2: soaking the rock core with a condensate oil sample, weighing the rock core to obtain condensate saturation, and then performing two-dimensional nuclear magnetic resonance $T_1$-$T_2$ test on the soaked rock core to obtain a two-dimensional nuclear magnetic resonance $T_1$-$T_2$ spectrum of a rock core sample, that is, obtaining signal intensity of the two-dimensional nuclear magnetic resonance $T_1$-$T_2$ spectrum of the rock core;

step S1.3: changing the condensate saturation by changing a soaking degree of the rock core in the condensate oil, and measuring a corresponding two-dimensional nuclear magnetic resonance $T_1$-$T_2$ spectrum; and step S1.4: obtaining five different saturations in the experiment and measuring two-dimensional nuclear magnetic resonance $T_1$-$T_2$ spectra corresponding to the saturations, and plotting a relationship between the signal intensity and the condensate saturation based on signal intensities of the two-dimensional nuclear magnetic resonance $T_1$-$T_2$ spectra of the five different condensate saturations.

In a preferred solution of the method for measuring critical condensate saturation pressure and critical condensate saturation of condensate gas by combining one-dimensional and two-dimensional nuclear magnetic resonance techniques according to the present invention, the step S2 includes the following specific operation processes:

step S2.1: cleaning and drying the rock core;

step S2.2: placing the rock core into a nuclear magnetic resonance holder, building internal pressure of the rock core by using pure methane, applying confining pressure higher than the internal pressure of the rock core by using a circulating fluorinated liquid, simultaneously controlling a back pressure pump to apply back pressure higher than the internal pressure of the rock core, starting a circulating heating device, and heating to an experimental temperature; continuously building pressure after the temperature rise is completed, and performing methane two-dimensional nuclear magnetic resonance $T_1$-$T_2$ spectrum test every 3 MPa in the methane pressure building process until the highest experimental pressure is reached;

step S2.3: injecting prepared high-pressure condensate gas into the rock core to displace the methane; injecting 10 PV condensate gas to complete condensate gas saturation, wherein an outlet gas-oil ratio reaches an initial gas-oil ratio, and then completing condensate gas saturation;

step S2.4: reducing the back pressure by controlling a back pressure pump, reducing by 3 MPa each time to simulate the depletion process, synchronously reducing the confining pressure, and performing one-dimensional nuclear magnetic resonance $T_2$ spectrum test and two-dimensional nuclear magnetic resonance $T_1$-$T_2$ spectrum test after each pressure point is stabilized for 2 hours to obtain a one-dimensional nuclear magnetic resonance $T_2$ spectrum and a two-dimensional nuclear magnetic resonance $T_1$-$T_2$ spectrum at each pressure point; and step S2.5: after the experiment is completed, closing the circulating heating device, dismantling experiment pipelines, cleaning experiment devices, and ending the experiment.

In a preferred solution of the method for measuring critical condensate saturation pressure and critical condensate saturation of condensate gas by combining one-dimensional and two-dimensional nuclear magnetic resonance techniques according to the present invention, in the step S2.2, the circulating fluorinated liquid applies confining pressure that is 3 MPa higher than the internal pressure of the rock core.

In a preferred solution of the method for measuring critical condensate saturation pressure and critical condensate saturation of condensate gas by combining one-dimensional and two-dimensional nuclear magnetic resonance techniques according to the present invention, in the step S2.2, the back pressure is ensured to be 2 MPa higher than the internal pressure of the rock core in the pressure building process.

In a preferred solution of the method for measuring critical condensate saturation pressure and critical condensate saturation of condensate gas by combining one-dimensional and two-dimensional nuclear magnetic resonance techniques according to the present invention, in the step S3, the improved difference spectroscopy method includes the following specific steps:

step S3.1: subtracting a two-dimensional nuclear magnetic resonance $T_1$-$T_2$ spectrum of a dry rock sample from all two-dimensional nuclear magnetic resonance $T_1$-$T_2$ spectra required to be used;

step S3.2: dividing signal intensity of a two-dimensional nuclear magnetic resonance $T_1$-$T_2$ spectrum scanned at a certain pressure point in the pressure building process by signal intensity of a two-dimensional nuclear magnetic resonance $T_1$-$T_2$ spectrum scanned at the highest experimental pressure point to obtain a series of ratios of pressure points to the highest experimental pressure point in the pressure building process, wherein the ratios are named as a condensate gas correction coefficient a, which is shown as follows;

the two-dimensional nuclear magnetic resonance $T_1$-$T_2$ spectrum at a certain pressure point:

$$\begin{bmatrix} A_{11} & \cdots & A_{1n} \\ \vdots & \ddots & \vdots \\ A_{n1} & \cdots & A_{nn} \end{bmatrix}$$

the two-dimensional nuclear magnetic resonance $T_1$-$T_2$ spectrum at the highest experimental pressure point:

$$\begin{bmatrix} B_{11} & \cdots & B_{1n} \\ \vdots & \ddots & \vdots \\ B_{n1} & \cdots & B_{nn} \end{bmatrix}$$

$$\text{Correction coefficient } a = \frac{A_{11} + A_{12} \cdots + A_{nn}}{B_{11} + B_{12} \cdots + B_{nn}}$$

step S3.3: multiplying an integral spectrum of a two-dimensional nuclear magnetic resonance $T_1$-$T_2$ spectrum of saturated condensate gas at the highest experimental pressure point by the correction coefficient a in the step S3.2 to obtain a new corrected two-dimensional nuclear magnetic resonance $T_1$-$T_2$ spectrum, wherein the spectrum is actually a two-dimensional nuclear magnetic resonance $T_1$-$T_2$ spectrum of pure condensate gas at a certain pressure point, which is shown as follows;

the two-dimensional nuclear magnetic resonance $T_1$-$T_2$ spectrum of the saturated condensate gas at the highest experimental pressure point:

$$\begin{bmatrix} C_{11} & \cdots & C_{1n} \\ \vdots & \ddots & \vdots \\ C_{n1} & \cdots & C_{nn} \end{bmatrix}$$

the two-dimensional nuclear magnetic resonance $T_1$-$T_2$ spectrum of actual condensate gas at a certain pressure point:

$$\begin{bmatrix} D_{11} & \cdots & D_{1n} \\ \vdots & \ddots & \vdots \\ D_{n1} & \cdots & D_{nn} \end{bmatrix}$$

the two-dimensional nuclear magnetic resonance $T_1$-$T_2$ spectrum of the pure condensate gas at a certain pressure point:

$$\begin{bmatrix} aC_{11} & \cdots & aC_{1n} \\ \vdots & \ddots & \vdots \\ aC_{n1} & \cdots & aC_{nn} \end{bmatrix}$$

step S3.4: subtracting the two-dimensional nuclear magnetic resonance $T_1$-$T_2$ spectrum of the pure condensate gas at the certain pressure point obtained in the step S3.3 from the two-dimensional nuclear magnetic resonance $T_1$-$T_2$ spectrum of the actual condensate gas at a certain pressure point in the depletion process, calculating a difference between the two-dimensional nuclear magnetic resonance $T_1$-$T_2$ spectra of the actual condensate gas and the pure condensate gas to obtain a new spectrum, wherein a positive part represents precipitated condensate oil, and a sum of the positive parts is signal intensity occupied by the precipitated condensate oil; and substituting the signal intensity into the relationship curve between the signal intensity and the condensate saturation in the step S1 to obtain condensate saturation at the certain pressure point, which is shown as follows;

the two-dimensional nuclear magnetic resonance $T_1$-$T_2$ spectrum of actual condensate gas at a certain pressure point—the two-dimensional nuclear magnetic resonance $T_1$-$T_2$ spectrum of pure condensate gas at a certain pressure point:

$$\begin{bmatrix} D_{11} & \cdots & D_{1n} \\ \vdots & \ddots & \vdots \\ D_{n1} & \cdots & D_{nn} \end{bmatrix} - \begin{bmatrix} aC_{11} & \cdots & aC_{1n} \\ \vdots & \ddots & \vdots \\ aC_{n1} & \cdots & aC_{nn} \end{bmatrix} = \begin{bmatrix} D_{11}-aC_{11} & \cdots & D_{1n}-aC_{1n} \\ \vdots & \ddots & \vdots \\ D_{n1}-aD_{n1} & \cdots & D_{nn}-aC_{nn} \end{bmatrix}$$

wherein the signal intensity occupied by the precipitated condensate oil is a sum of all positive numbers in the matrix:

$$\sum_{i=1}^{n}\sum_{i=1}^{n}(D_{ij}-aC_{ij}) \cdot II(D_{ij}-aC_{ij}>0)$$

wherein i represents a row index, j represents a column index, and the matrix is n×n; $II(D_{ij}-aC_{ij}>0)$ is an indication function, when $D_{ij}-aC_{ij}>0$, the indication function is 1, and otherwise, the indication function is 0; and step S3.5: repeating the step S3.2 to the step S3.4, and calculating signal intensity occupied by condensate oil precipitated at each pressure, thereby obtaining condensate saturation corresponding to each pressure point and finally obtaining a relationship curve between the pressure and the condensate saturation.

In a preferred solution of the method for measuring critical condensate saturation pressure and critical condensate saturation of condensate gas by combining one-dimensional and two-dimensional nuclear magnetic resonance techniques according to the present invention, the step S5 includes the following specific operation processes:

step S5.1: filling a rock core into a long rock core holder, and displacing methane by using condensate gas after pressure building is completed by using methane to establish reservoir conditions;

step S5.2: gradually reducing the pressure at a certain speed, and observing the phenomenon in a high-pressure visual window;

step S5.3: when a first drop of oil appears in the visual window, taking condensate saturation in the corresponding rock core as critical condensate saturation, and recording an outlet pressure $P_0$ of the corresponding long rock core holder; and step S5.4: establishing a long rock core numerical simulation model based on physical property parameters of a long rock core, simulating a long rock core depletion experiment process, and finally determining critical condensate saturation of the condensate gas in the long rock core depletion experiment process according to the critical condensate saturation pressure $P_0$ determined by the long rock core experiment.

Compared with the existing methods, the present invention has the following beneficial effects:

During the development of condensate gas reservoirs, the pressure reduction causes condensate oil to precipitate and block an oil and gas flow channel. However, when the condensate saturation increases to a certain level, the condensate oil begins to flow continuously. The continuous flow of condensate oil may greatly reduce the blockage of the flow channel by condensate oil. Therefore, it is particularly important to determine critical condensate saturation pressure and critical condensate saturation for the development of condensate gas reservoirs. Through a nuclear magnetic resonance method, an improved two-dimensional nuclear magnetic resonance difference spectroscopy method is creatively adopted to improve an artificial zoning method, so that errors caused by artificial signal zoning are avoided, the critical condensate saturation pressure and critical condensate saturation can be more accurately measured, the flow law of condensate oil and gas two-phases in the formation is better studied, a more reasonable development plan is favorably formulated by a gas reservoir, and theoretical guidance is provided for improving the condensate recovery ratio.

1. The present invention directly measures the condensate saturation inside the rock core, rather than a traditional calculation method of inferring the saturation inside the rock core by analyzing the produced material. The measurement result of the present invention is more intuitive and reliable.

2. The existing two-dimensional nuclear magnetic resonance difference spectroscopy method mainly measures porosity or irreducible phase occupied porosity, but does not have fluid identification capability. The present invention creatively proposes a novel method for identifying and measuring condensate saturation using an improved two-dimensional nuclear magnetic resonance difference spectroscopy method, rather than the traditional method of calculating condensate saturation based on artificial zoning. The disadvantage of artificial zoning is that some oil signals in the divided zones are counted into the gas zones, resulting in a deviation in the measured condensate saturation. This method improves the artificial zoning method, avoids the error introduced by artificial signal zoning, greatly improves the condensate signal identification precision, and more accurately measures condensate saturation.

3. Most of the existing critical condensate saturation pressure measurement is performed through a long rock core experiment, the critical condensate saturation pressure is determined when a first drop of oil is observed to flow out of a rock core in a high-temperature and high-pressure observation window. However, the dead volume in the pipeline will have a certain impact on the accuracy of the experiment. According to the present invention, through the testing means of the combination and verification of one-dimensional nuclear magnetic resonance and two-dimensional nuclear magnetic resonance, the rate at which hydrogen-containing substances leave the rock core may be accurately measured by the change of nuclear magnetic resonance signal intensities inside the rock core, so that the critical condensate saturation pressure may be more accurately determined, and the impact of dead volume of pipeline on measurement is avoided.

4. The present invention combines nuclear magnetic resonance experiments and core numerical simulations, and the two results jointly verify the accuracy of the critical condensate saturation pressure and the critical condensate saturation, thereby ensuring the reliability of the present invention.

BRIEF DESCRIPTION OF DRAWINGS

To describe the technical solutions in embodiments of the present invention more clearly, the following briefly describes the accompanying drawings for describing embodiments. It is clear that the accompanying drawings in the following description show merely some embodiments of the present invention, and a person of ordinary skill in the art may derive other drawings from these accompanying drawings without creative efforts. In the drawings:

In FIG. 3, 1. 2. 3. 4: valves; 5: displacement pump; 6: methane sampler; 7: condensate gas sampler; 8: magnet; 9: nuclear magnetic resonance rock core holder; 10: heating belt; 11: circulating heating device; 12: confining pressure pump; 13: back pressure valve; 14: back pressure pump; 15: gas-liquid separator; 16: gas meter; 17: signal receiving device;

DESCRIPTION OF EMBODIMENTS

Figure 1:
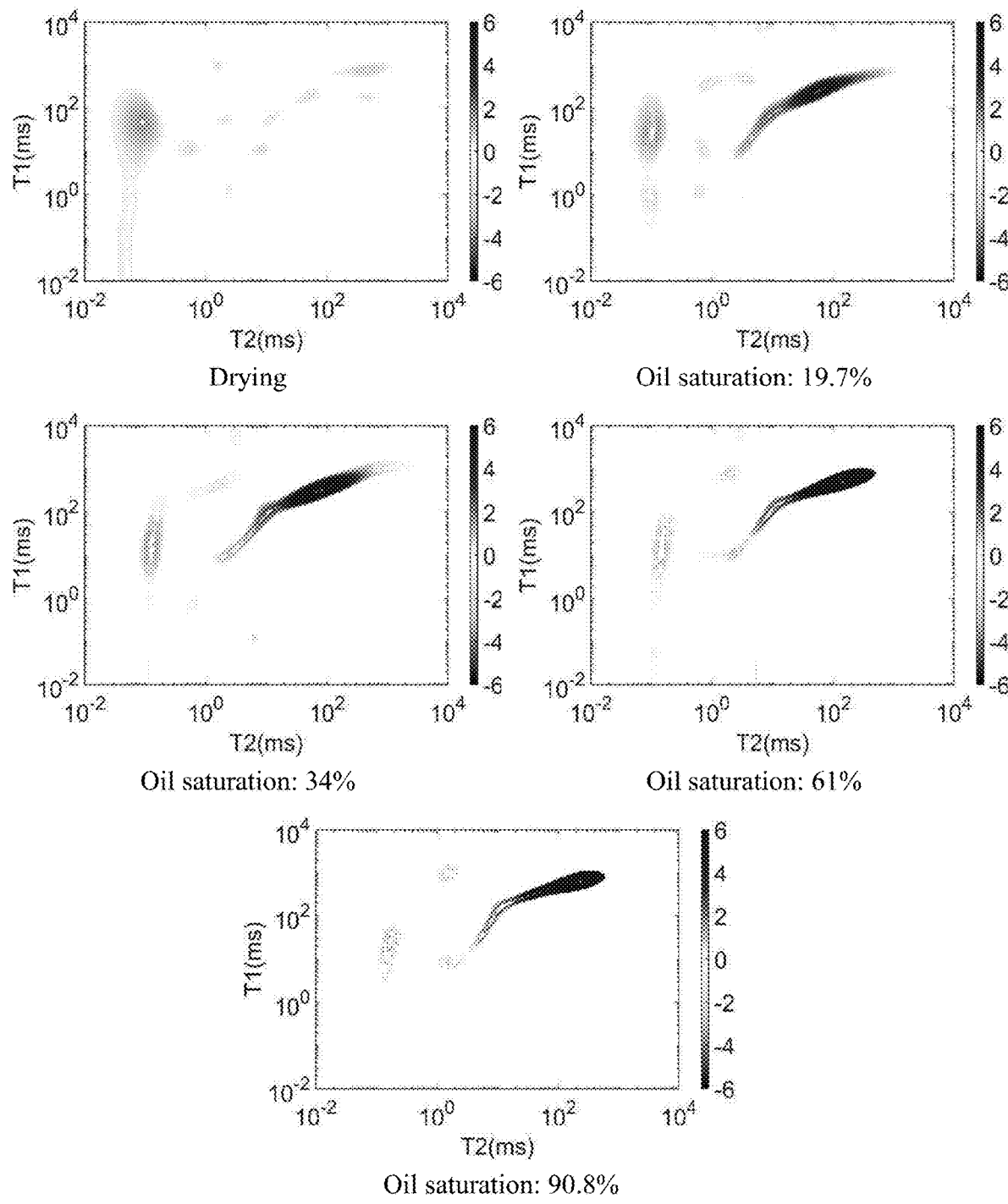
FIG. 1 is an original two-dimensional nuclear magnetic resonance $T_1$-$T_2$ images corresponding to different condensate saturations during the calibration process.

To make the objectives, features, and advantages of the present invention more apparent and understandable, the following describes specific embodiments of the present invention in detail with reference to accompanying drawings.

In the following description, numerous specific details are described to facilitate a full understanding of the present invention. However, the present invention may also be implemented in other ways different from those described herein. Those skilled in the art may make similar generalizations without violating the connotation of the present invention. Therefore, the present invention is not limited to the specific embodiments disclosed below.

Furthermore, "one embodiment" or "embodiments" as referred to herein refers to a particular feature, structure, or characteristic that may be included in at least one implementation of the present invention. The phrase "in one embodiment" appearing in different places in this specification does not necessarily refer to the same embodiment, nor is this phrase a separate or alternative embodiment that is mutually exclusive of other embodiments.

To achieve the above technical objective, the present invention adopts the following technical solution, which includes the following steps:

Step S1: performing calibration experiment on condensate signal intensity and condensate saturation to obtain a relationship curve between the condensate signal intensity and the condensate saturation; wherein only related information of the signal intensity may be obtained in a two-dimensional nuclear magnetic resonance $T_1$-$T_2$ spectrum, and specific value of the saturation cannot be directly obtained, so that a calibration experiment needs to be firstly performed on the signal intensity and the saturation of the condensate oil, and the specific operation processes are as follows:

step S1.1: cleaning and drying a rock core;

step S1.2: soaking the rock core with a condensate oil sample, weighing the rock core to obtain condensate saturation, and then performing two-dimensional nuclear magnetic resonance $T_1$-$T_2$ test on the soaked rock core to obtain a two-dimensional nuclear magnetic resonance $T_1$-$T_2$ spectrum of a rock core sample, that is, obtaining signal intensity of the two-dimensional nuclear magnetic resonance $T_1$-$T_2$ spectrum of the rock core;

step S1.3: changing the condensate saturation by changing a soaking degree of the rock core in the condensate oil, and measuring a corresponding two-dimensional nuclear magnetic resonance $T_1$-$T_2$ spectrum; and step S1.4: obtaining five different saturations in the experiment and measuring two-dimensional nuclear magnetic resonance $T_1$-$T_2$ spectra corresponding to the saturations, and plotting a relationship between the signal intensity and the condensate saturation based on signal intensities of the two-dimensional nuclear magnetic resonance $T_1$-$T_2$ spectra of the five different condensate saturations.

Step S2: performing depletion experiment on the rock core, and acquiring a one-dimensional nuclear magnetic resonance $T_2$ spectrum and a two-dimensional nuclear magnetic resonance $T_1$-$T_2$ spectrum at each pressure point; wherein the specific operation processes are as follows:

step S2.1: cleaning and drying the rock core;

step S2.2: placing the rock core into a nuclear magnetic resonance holder, building internal pressure of the rock core by using pure methane, applying confining pressure 3 MPa higher than the internal pressure of the rock core by using a circulating fluorinated liquid, simultaneously controlling a back pressure pump to apply back pressure 2 MPa higher than the internal pressure of the rock core, starting a circulating heating device, and heating to an experimental temperature; continuously building pressure after the temperature rise is completed, and performing methane two-dimensional nuclear magnetic resonance $T_1$-$T_2$ spectrum test every 3 MPa in the methane pressure building process until the highest experimental pressure is reached;

step S2.3: injecting prepared high-pressure condensate gas into the rock core to displace the methane; injecting 10 PV condensate gas to complete condensate gas saturation, wherein an outlet gas-oil ratio reaches an initial gas-oil ratio, and then completing condensate gas saturation;

step S2.4: reducing the back pressure by controlling a back pressure pump, reducing by 3 MPa each time to simulate the depletion process, synchronously reducing the confining pressure, and performing one-dimensional nuclear magnetic resonance $T_2$ spectrum test and two-dimensional nuclear magnetic resonance $T_1$-$T_2$ spectrum test after each pressure point is stabilized for 2 hours to obtain a one-dimensional nuclear magnetic resonance $T_2$ spectrum and a two-dimensional nuclear magnetic resonance $T_1$-$T_2$ spectrum at each pressure point; and step S2.5: after the experiment is completed, closing the circulating heating device, dismantling experiment pipelines, cleaning experiment devices, and ending the experiment.

Step S3: calculating the condensate saturation by using an improved difference spectroscopy method through original data of the two-dimensional nuclear magnetic resonance $T_1$-$T_2$ spectrum obtained in the step S2; wherein the two-dimensional nuclear magnetic resonance $T_1$-$T_2$ spectrum calibration is completed by experimental design, subtraction or addition of gas signals in the oil zones and oil signals in the gas zones is achieved, the traditional artificial zoning method for identifying oil and gas is improved, the condensate signal identification precision is greatly improved, and the condensate saturation is accurately measured; this method improves the artificial zoning method, avoids the error introduced by artificial signal zoning, greatly improves the condensate signal identification precision, and more accurately measures condensate saturation; and the improved difference spectroscopy method includes the following specific steps:

step S3.1: subtracting a two-dimensional nuclear magnetic resonance $T_1$-$T_2$ spectrum of a dry rock sample from all two-dimensional nuclear magnetic resonance $T_1$-$T_2$ spectra required to be used, wherein this step is to ensure that original hydrogen-containing substances in the rock core cannot influence subsequent calculation of the condensate saturation;

step S3.2: dividing signal intensity of a two-dimensional nuclear magnetic resonance $T_1$-$T_2$ spectrum scanned at a certain pressure point in the pressure building process by signal intensity of a two-dimensional nuclear magnetic resonance $T_1$-$T_2$ spectrum scanned at the highest experimental pressure point to obtain a series of ratios of pressure points to the highest experimental pressure point in the pressure building process, wherein the ratios are named as a condensate gas correction coefficient a, which is shown as follows;

the two-dimensional nuclear magnetic resonance $T_1$-$T_2$ spectrum at a certain pressure point:

$$\begin{bmatrix} A_{11} & \cdots & A_{1n} \\ \vdots & \ddots & \vdots \\ A_{n1} & \cdots & A_{nn} \end{bmatrix}$$

the two-dimensional nuclear magnetic resonance $T_1$-$T_2$ spectrum at the highest experimental pressure point:

$$\begin{bmatrix} B_{11} & \cdots & B_{1n} \\ \vdots & \ddots & \vdots \\ B_{n1} & \cdots & B_{nn} \end{bmatrix}$$

$$\text{Correction coefficient } a = \frac{A_{11} + A_{12} \cdots + A_{nn}}{B_{11} + B_{12} \cdots + B_{nn}}$$

step S3.3: multiplying an integral spectrum of a two-dimensional nuclear magnetic resonance $T_1$-$T_2$ spectrum of saturated condensate gas at the highest experimental pressure point by the correction coefficient a in the step S3.2 to obtain a new corrected two-dimensional nuclear magnetic resonance $T_1$-$T_2$ spectrum, wherein the spectrum is actually a two-dimensional nuclear magnetic resonance $T_1$-$T_2$ spectrum of pure condensate gas (without condensate oil precipitated) at a certain pressure point, which is shown as follows;

the two-dimensional nuclear magnetic resonance $T_1$-$T_2$ spectrum of the saturated condensate gas at the highest experimental pressure point:

$$\begin{bmatrix} C_{11} & \cdots & C_{1n} \\ \vdots & \ddots & \vdots \\ C_{n1} & \cdots & C_{nn} \end{bmatrix}$$

the two-dimensional nuclear magnetic resonance $T_1$-$T_2$ spectrum of actual condensate gas at a certain pressure point:

$$\begin{bmatrix} D_{11} & \cdots & D_{1n} \\ \vdots & \ddots & \vdots \\ D_{n1} & \cdots & D_{nn} \end{bmatrix}$$

the two-dimensional nuclear magnetic resonance $T_1$-$T_2$ spectrum of the pure condensate gas at a certain pressure point:

$$\begin{bmatrix} aC_{11} & \cdots & aC_{1n} \\ \vdots & \ddots & \vdots \\ aC_{n1} & \cdots & aC_{nn} \end{bmatrix}$$

step S3.4: subtracting the two-dimensional nuclear magnetic resonance $T_1$-$T_2$ spectrum of the pure condensate gas (without condensate oil precipitated) at the certain pressure point obtained in the step S3.3 from the two-dimensional nuclear magnetic resonance $T_1$-$T_2$ spectrum of the actual condensate gas (with condensate oil precipitated) at a certain pressure point in the depletion process, calculating a difference between the two-dimensional nuclear magnetic resonance $T_1$-$T_2$ spectra of the actual condensate gas and the pure condensate gas to obtain a new spectrum, wherein a positive part represents precipitated condensate oil, and a sum of the positive parts is signal intensity occupied by the precipitated condensate oil; and substituting the signal intensity into the relationship curve between the signal intensity and the condensate saturation in the step S1 to obtain condensate saturation at the certain pressure point, which is shown as follows;

the two-dimensional nuclear magnetic resonance $T_1$-$T_2$ spectrum of actual condensate gas at a certain pressure point—the two-dimensional nuclear magnetic resonance $T_1$-$T_2$ spectrum of pure condensate gas at a certain pressure point:

$$\begin{bmatrix} D_{11} & \cdots & D_{1n} \\ \vdots & \ddots & \vdots \\ D_{n1} & \cdots & D_{nn} \end{bmatrix} - \begin{bmatrix} aC_{11} & \cdots & aC_{1n} \\ \vdots & \ddots & \vdots \\ aC_{n1} & \cdots & aC_{nn} \end{bmatrix} = \begin{bmatrix} D_{11} - aC_{11} & \cdots & D_{1n} - aC_{1n} \\ \vdots & \ddots & \vdots \\ D_{n1} - aD_{n1} & \cdots & D_{nn} - aC_{nn} \end{bmatrix}$$

wherein the signal intensity occupied by the precipitated condensate oil is a sum of all positive numbers in the matrix:

$$\sum_{i=1}^{n}\sum_{j=1}^{n}(D_{ij} - aC_{ij}) \cdot II(D_{ij} - aC_{ij} > 0)$$

wherein i represents a row index, j represents a column index, and the matrix is n×n; $II(D_{ij}-aC_{ij}>0)$ is an indication function, when $D_{ij}-aC_{ij}>0$; the indication function is 1, and otherwise, the indication function is 0; and step S3.5: repeating the step S3.2 to the step S3.4, and calculating signal intensity occupied by condensate oil precipitated at each pressure, thereby obtaining condensate saturation corresponding to each pressure point and finally obtaining a relationship curve between the pressure and the condensate saturation.

Step S4: plotting a relationship curve between total signal intensity and pressure by total signal intensity of the one-dimensional nuclear magnetic resonance $T_2$ spectrum and total signal intensity of the two-dimensional nuclear magnetic resonance $T_1$-$T_2$ spectrum obtained in the depletion experiment, and obtaining a pressure point corresponding to a sudden drop point of the curve, wherein the pressure point is a critical condensate saturation pressure point; then calculating critical condensate saturation corresponding to the critical condensate saturation pressure according to a relationship curve between pressure and condensate saturation obtained by an improved difference spectroscopy method.

Step S5: verifying the reliability of the critical condensate saturation pressure and the critical condensate saturation by adopting a long rock core depletion experiment and numerical simulation; wherein the specific operation processes are as follows:

step S5.1: filling a rock core into a long rock core holder, and displacing methane by using condensate gas after pressure building is completed by using methane to establish reservoir conditions;

step S5.2: gradually reducing the pressure at a certain speed, and observing the phenomenon in a high-pressure visual window;

step S5.3: when a first drop of oil appears in the visual window, taking condensate saturation in the corresponding rock core as critical condensate saturation, and recording an outlet pressure $P_0$ of the corresponding long rock core holder; and step S5.4: establishing a long rock core numerical simulation model based on physical property parameters of a long rock core, simulating a long rock core depletion experiment process, and finally determining critical condensate saturation of the condensate gas in the long rock core depletion experiment process according to the critical condensate saturation pressure $P_0$ determined by the long rock core experiment.

Embodiment

A rock core selected in this embodiment is a plunger core sample of an actual sandstone reservoir of a condensate gas reservoir. The specific parameters are shown in Table 1:

TABLE 1

Specific parameters of core sample

| Length (cm) | Diameter (cm) | Dry weight (g) | Permeability (mD) | Porosity (%) | Pore volume (cm³) |
|---|---|---|---|---|---|
| 6.9 | 2.5 | 69.6 | 16 | 22.01 | 7.292 |

The compositions of the condensate gas fluid sample selected in this embodiment are shown in Table 2:

TABLE 2

Compositions of condensate gas fluid sample

| Condensate content | Gas phase composition | Oil phase composition | Gas-oil ratio (cm³) |
|---|---|---|---|
| High condensate content | 93% methane | 0.7% hexane + 6.3% decane | 1454 |

Step I: The calibration experiment was performed on condensate signal intensity and condensate saturation:

(1) A rock core was dried and weighed to 69.6 g.

(2) The rock core was soaked in a condensate oil sample (10% hexane+90% decane) and then weighed to obtain the condensate saturation. A two-dimensional nuclear magnetic resonance $T_1$-$T_2$ spectrum of the rock core sample was obtained by performing a two-dimensional nuclear magnetic resonance $T_1$-$T_2$ test, so as to obtain signal intensity of the two-dimensional nuclear magnetic resonance $T_1$-$T_2$ spectrum of the rock core.

(3) The condensate saturation was changed by changing a soaking degree of the rock core in the condensate oil, a corresponding two-dimensional nuclear magnetic resonance $T_1$-$T_2$ spectrum was measured, an original image is as shown in FIG. 1, the condensate saturation and the signal intensity of the two-dimensional nuclear magnetic resonance $T_1$-$T_2$ spectrum were measured five times, and the experimental data are as shown in Table 3.

TABLE 3

Condensate saturation and signal intensity of two-dimensional nuclear magnetic resonance $T_1$-$T_2$ spectra

| Rock core weighing, g | Condensate saturation (%) | Signal intensity of two-dimensional nuclear magnetic resonance $T_1$-$T_2$ spectra (a.u.) |
|---|---|---|
| 69.6 | 0 | 71 |
| 70.6 | 19.7 | 1036 |
| 71.3 | 34.0 | 1737 |
| 72.7 | 61.0 | 3095 |
| 74.2 | 90.8 | 4510 |

Figure 2:
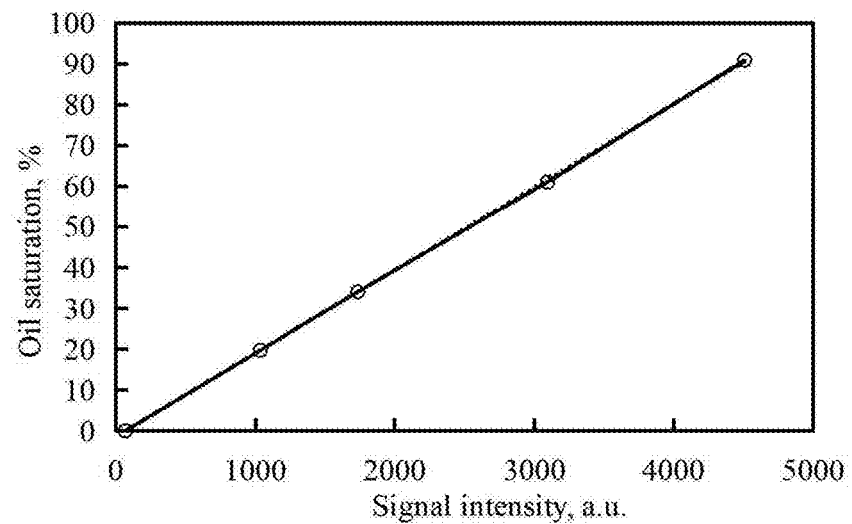
FIG. 2 is a diagram of a relationship curve between calibrated condensate saturation and signal intensity.

(4) The condensate saturation in the rock core is increased along with the increase of the signal intensity of a two-dimensional nuclear magnetic resonance $T_1$-$T_2$ spectrum, the regression formula is y=0.0204x−1.5111, and a calibration curve is shown in FIG. 2 and has a good linear relation. This formula is a calibration formula for quantitatively determining the condensate signal intensity and condensate saturation during the condensate gas depletion process. Subsequently, the condensate signal intensity in the two-dimensional nuclear magnetic resonance $T_1$-$T_2$ spectrum acquired under different pressures in the depletion process is identified and calculated, and the obtained condensate signal intensity is substituted into the calibration formula to quantitatively obtain the condensate saturation corresponding to each pressure point in the rock core depletion process.

Figure 3:
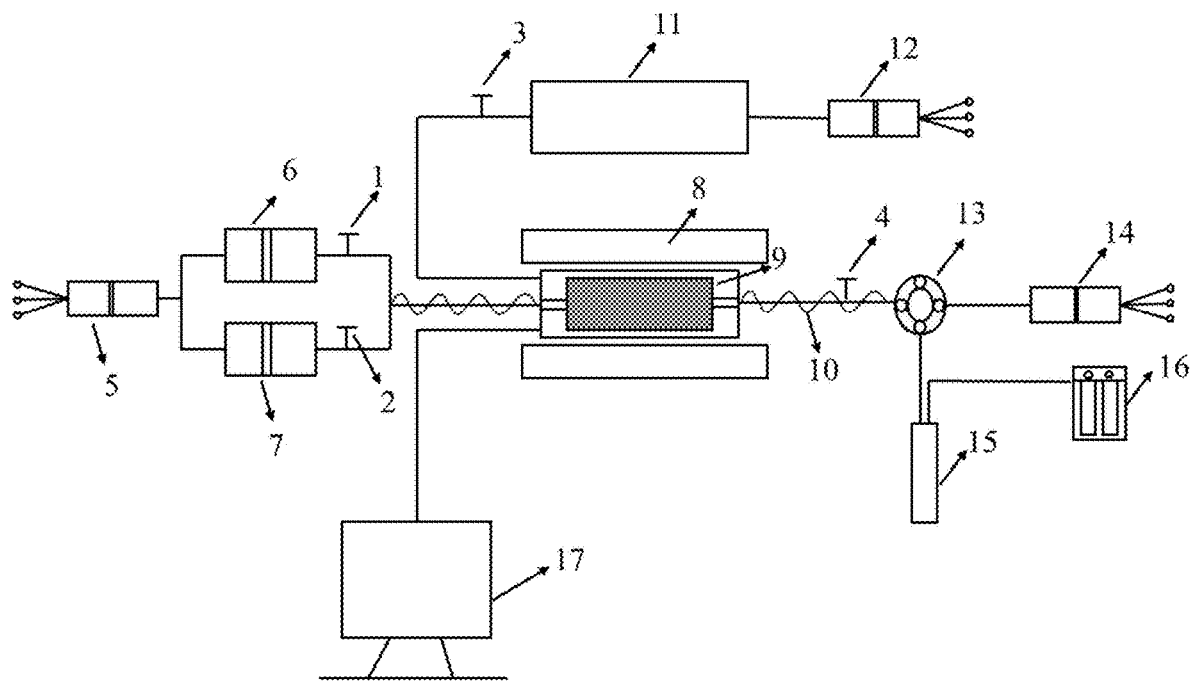
FIG. 3 is a diagram of a nuclear magnetic resonance-based condensate gas depletion experimental device.

Step II: The depletion experiment was performed, the experimental device diagram is shown in FIG. 3, and the specific operation steps are as follows:

(1) The rock core was dried for 24 h after being cleaned.

(2) The rock core was placed into a nuclear magnetic resonance rock core holder, valve 1 and valve 4 were opened, methane was injected into the rock core at 0.125 mL/min by using a displacement pump to build internal pressure, and back pressure that was always 2 MPa higher than the internal pressure was continuously applied by a back pressure pump. Meanwhile, valve 3 was opened, and the circulating fluorinated liquid was subjected to a confining pressure that was always 3 MPa higher than the internal pressure. When the internal pressure reached 5 MPa, the circulating heating device was turned on and the temperature was raised to 70° C. After the temperature rise was completed, the pressure building was continued. During the pressure building process, the two-dimensional nuclear magnetic resonance $T_1$-$T_2$ spectrum of methane was scanned every 3 MPa until the highest experimental pressure point was 30 MPa, and then valve 1 was closed.

(3) The valve 2 was opened, the prepared 30 MPa high-pressure condensate gas was injected into the rock core at a speed of 0.125 mL/min to displace the methane, 10 PV condensate gas was injected to complete condensate gas saturation, and when the outlet gas-oil ratio reached the initial gas-oil ratio of 1454 m3/m3, the condensate gas saturation was completed and valve 2 was closed.

(4) The back pressure was reduced by controlling a back pressure pump, the depletion process was simulated by reducing 3 MPa each time, the confining pressure was synchronously reduced, a one-dimensional nuclear magnetic resonance $T_2$ test and a two-dimensional nuclear magnetic resonance $T_1$-$T_2$ test were performed after each pressure point was stabilized for 2 h, and a one-dimensional nuclear magnetic resonance $T_1$ spectrum and a two-dimensional nuclear magnetic resonance $T_1$-$T_2$ spectrum at each stable pressure point were obtained until the pressure was reduced to the waste pressure.

(5) After the experiment was completed, the circulating heating device was closed, the experiment pipelines were dismantled, the experiment devices were cleaned, and the experiment was ended.

Figure 4:
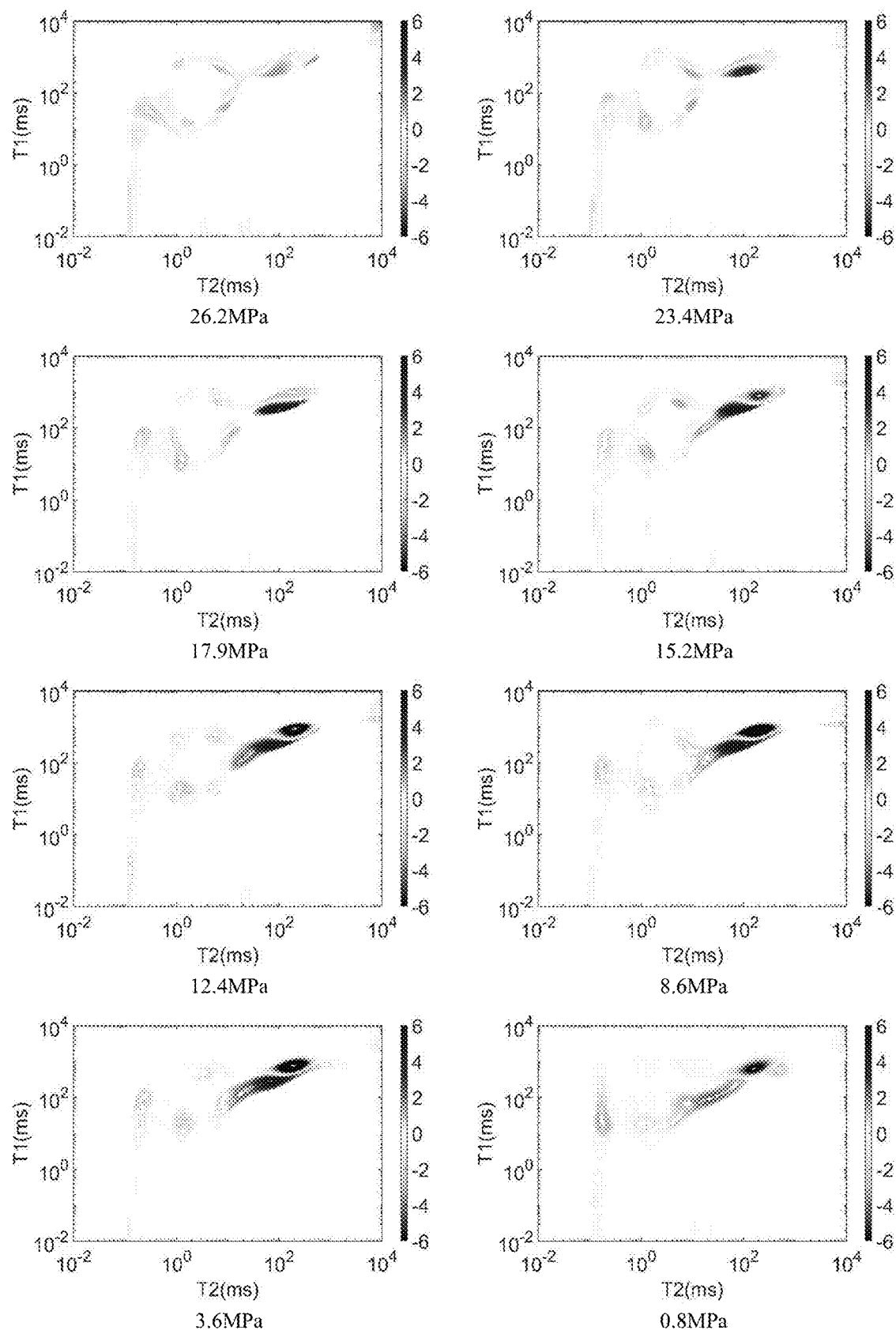
FIG. 4 is two-dimensional nuclear magnetic resonance $T_1$-$T_2$ spectra at different pressures after differential spectroscopy.
Figure 5:
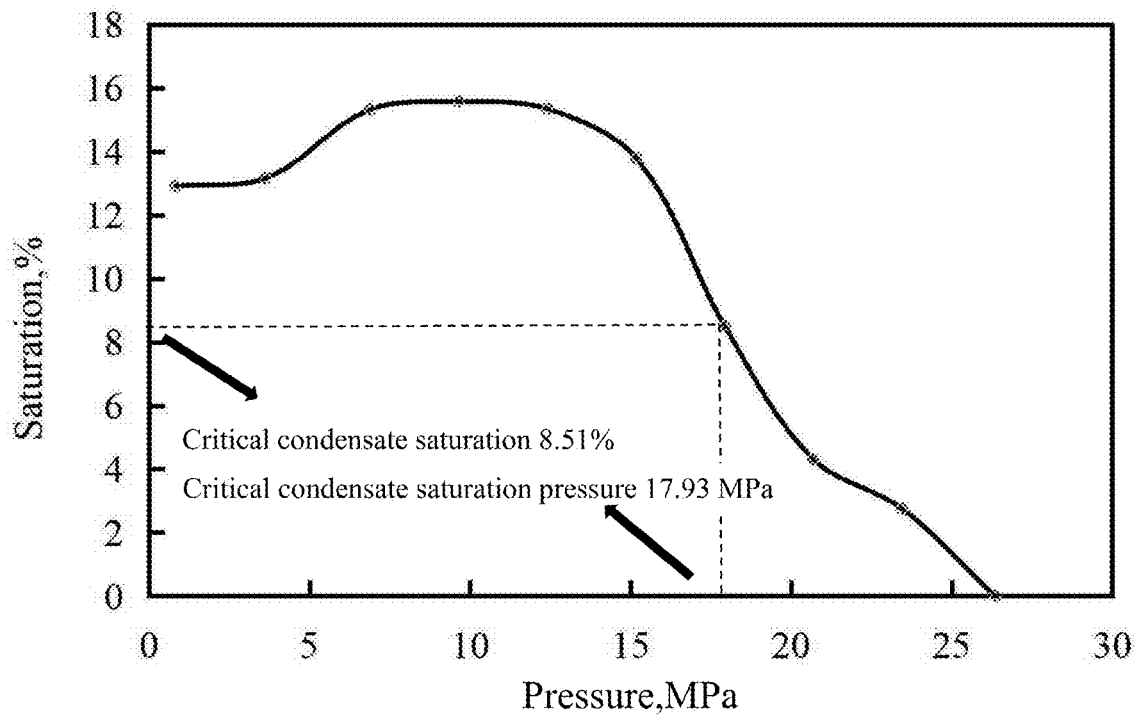
FIG. 5 is a diagram of a relationship curve between pressure and condensate saturation during the condensate gas depletion process.

Step III: Data processing was performed, after the depletion experiment was completed, and the experimental data was processed. Since the original two-dimensional nuclear magnetic resonance $T_1$-$T_2$ spectrum obtained by nuclear magnetic scanning is difficult to directly divide the signal intensity of the condensate oil, the original two-dimensional nuclear magnetic resonance $T_1$-$T_2$ spectrum needs to be processed by an improved difference spectroscopy method. Taking a two-dimensional nuclear magnetic resonance $T_1$-$T_2$ spectrum of 23.4 MPa processed by a difference spectroscopy method as an example:

(1) Subtracting a two-dimensional nuclear magnetic resonance $T_1$-$T_2$ spectrum of a dry rock sample from all required two-dimensional nuclear magnetic resonance $T_1$-$T_2$ spectra;

(2) Dividing the signal intensity of the two-dimensional nuclear magnetic resonance $T_1$-$T_2$ spectrum of methane at 23.4 MPa (2871) by the signal intensity of the two-dimensional nuclear magnetic resonance $T_1$-$T_2$ spectrum of methane at 30 MPa (3149) to obtain the condensate gas correction factor a=0.91;

(3) Multiplying the integral spectrum of the two-dimensional nuclear magnetic resonance $T_1$-$T_2$ spectrum of the saturated condensate gas at 30 MPa by the correction coefficient a=0.91 to obtain a new corrected two-dimensional nuclear magnetic resonance $T_1$-$T_2$ spectrum, wherein this spectrum is a two-dimensional nuclear magnetic resonance $T_1$-$T_2$ spectrum of the pure condensate gas at 23.4 MPa (without condensate oil precipitated);

(4) Subtracting the corrected two-dimensional nuclear magnetic resonance $T_1$-$T_2$ spectrum of pure condensate gas at 23.4 MPa obtained in the step (3) from the two-dimensional nuclear magnetic resonance $T_1$-$T_2$ spectrum of actual condensate gas (with condensate oil precipitated) at 23.4 MPa, calculating a difference between the two-dimensional nuclear magnetic resonance $T_1$-$T_2$ spectra of the actual condensate gas and the pure condensate gas to obtain a new $T_1$-$T_2$ spectrum, wherein a positive part represents precipitated condensate oil, and a sum of all positive parts 209 is signal intensity of condensate oil precipitated at 23.4 MPa; and substituting this signal intensity into the calibration formula y=0.0204x−1.5111, and obtaining the condensate saturation at 23.4 MPa as 2.75%; and (5) Obtaining the $T_1$-$T_2$ spectrum obtained after difference spectroscopy processing, as shown in FIG. 4, where the red portion is the precipitated condensate oil. The step (2) to step (4) were repeated to calculate the signal intensity of the condensate oil precipitated at each other pressure, and then the signal intensity was substituted into the calibration formula of condensate signal and condensate saturation y=0.024x−1.5111. The results of condensate saturation at different pressures are obtained, as shown in Table 4. The relationship curve between condensate saturation and pressure is shown in FIG. 5.

TABLE 4

Condensate saturations at different pressures

| Pressure (MPa) | Condensate signal intensity (a.u.) | Condensate saturation (%) |
| --- | --- | --- |
| 26.2 | 0 | 0.00 |
| 23.4 | 209 | 2.75 |
| 20.7 | 285 | 4.30 |
| 17.9 | 491 | 8.51 |
| 15.2 | 750 | 13.79 |
| 12.4 | 826 | 15.34 |
| 9.7 | 837 | 15.56 |
| 6.9 | 825 | 15.32 |
| 3.6 | 719 | 13.16 |
| 0.8 | 707 | 12.91 |

Figure 6:
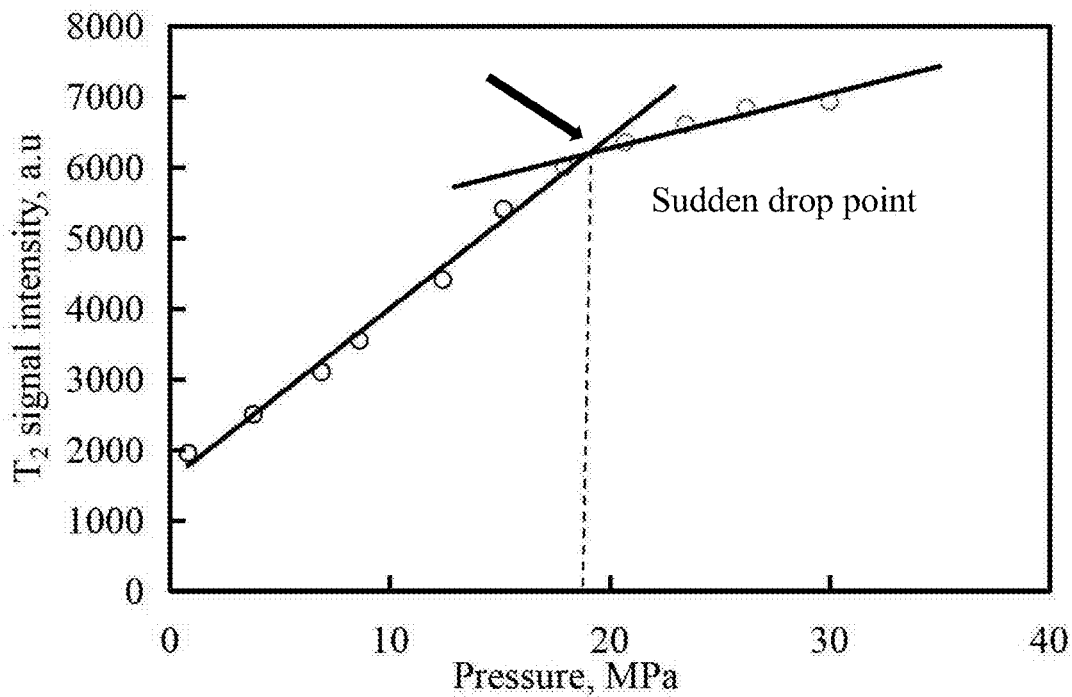
FIG. 6 is a diagram of a relationship between total signal intensity of a two-dimensional nuclear magnetic resonance $T_1$-$T_2$ spectrum and pressure.
Figure 7:
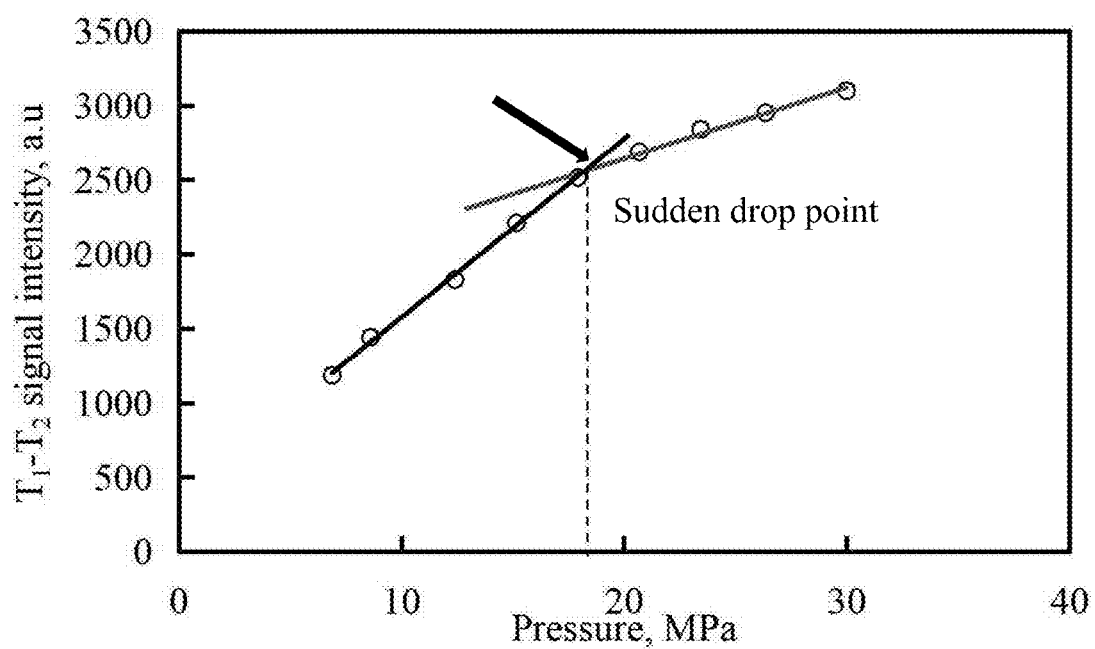
FIG. 7 is a diagram of a relationship between total signal intensity of a one-dimensional nuclear magnetic resonance $T_2$ spectrum and pressure.

Step IV: The critical condensate saturation pressure and the critical condensate saturation were calculated:

(1) A relationship between the total signal intensity of the two-dimensional nuclear magnetic resonance $T_1$-$T_2$ spectrum and pressure in the depletion process was made, as shown in FIG. 6; and a relationship between the total signal intensity of the one-dimensional nuclear magnetic resonance $T_2$ spectrum and pressure was made, as shown in FIG. 7.

(2) The relationship curve between the total signal intensity of the one-dimensional nuclear magnetic resonance $T_2$ spectrum and the two-dimensional nuclear magnetic resonance $T_1$-$T_2$ spectrum with high condensate content and the pressure has obvious a sudden drop point near 17.93 MPa, which shows that the condensate oil starts to continuously flow and leaves the rock core in a large amount under this pressure, so that the 17.93 MPa is the critical condensate saturation pressure in this embodiment. According to the relationship curve between pressure and condensate saturation during condensate gas depletion in FIG. 5, it is concluded that the critical condensate saturation is 8.51%.

Step V: The experimental result was verified:

(1) Filling a rock core into a long rock core holder, and displacing methane by using condensate gas after pressure building is completed by using methane to establish reservoir conditions.

(2) Gradually reducing the pressure at the depletion speed of 3 MPa/h, and recording the outlet pressure of the long rock core holder when a first drop of oil is observed on a visual window as 18.15 MPa.

(3) Establishing a long rock core numerical simulation model based on physical property parameters of the long rock core, simulating the depletion process of the long rock core, and determining the critical condensate saturation of the condensate gas in the depletion process of the long rock core to be 8.68% according to the critical condensate saturation pressure of 18.15 MPa determined in the step (2).

(4) The relative error between the critical condensate saturation pressures calculated by the two experimental methods is 1.21%, and the relative error between the critical condensate saturations is 2.00%.

It should be noted that the foregoing embodiments are merely intended for illustrating the technical solutions of the present invention and do not limit the present invention. Although the present invention is described in detail with reference to the preferred embodiments, those of ordinary skill in the art understand that the technical solutions of the present invention can be modified or equivalently substituted without departing from the essence and scope of the technical solutions of the present invention and should all be covered by the scope of the claims of the present invention.

What is claimed is:

1. A method for measuring critical condensate saturation pressure and critical condensate saturation of condensate gas by combining one-dimensional and two-dimensional nuclear magnetic resonance techniques, comprising the following steps:

step S1: performing calibration experiment on condensate signal intensity and condensate saturation to obtain a relationship curve between the signal intensity and the saturation;

step S2: performing depletion experiment on a rock core, and acquiring a one-dimensional nuclear magnetic resonance $T_2$ spectrum and a two-dimensional nuclear magnetic resonance $T_1$-$T_2$ spectrum at each pressure point;

step S3: calculating the condensate saturation by using an improved difference spectroscopy method through original data of the two-dimensional nuclear magnetic resonance $T_1$-$T_2$ spectrum obtained in the step S2; wherein the improved difference spectroscopy method comprises the following specific steps:

step S3.1: subtracting a two-dimensional nuclear magnetic resonance $T_1$-$T_2$ spectrum of a dry rock sample from all two-dimensional nuclear magnetic resonance $T_1$-$T_2$ spectra required to be used;

step S3.2: dividing signal intensity of a two-dimensional nuclear magnetic resonance $T_1$-$T_2$ spectrum scanned at a certain pressure point in the pressure building process by signal intensity of a two-dimensional nuclear magnetic resonance $T_1$-$T_2$ spectrum scanned at the highest experimental pressure point to obtain a series of ratios of pressure points to the highest experimental pressure point in the pressure building process, wherein the ratios are named as a condensate gas correction coefficient a, which is shown as follows;

the two-dimensional nuclear magnetic resonance $T_1$-$T_2$ spectrum at the certain pressure point:

$$\begin{bmatrix} A_{11} & \cdots & A_{1n} \\ \vdots & \ddots & \vdots \\ A_{n1} & \cdots & A_{nn} \end{bmatrix}$$

the two-dimensional nuclear magnetic resonance $T_1$-$T_2$ spectrum at the highest experimental pressure point:

$$\begin{bmatrix} B_{11} & \cdots & B_{1n} \\ \vdots & \ddots & \vdots \\ B_{n1} & \cdots & B_{nn} \end{bmatrix}$$

$$\text{Correction coefficient } a = \frac{A_{11} + A_{12} \cdots + A_{nn}}{B_{11} + B_{12} \cdots + B_{nn}}$$

step S3.3: multiplying an integral spectrum of a two-dimensional nuclear magnetic resonance $T_1$-$T_2$ spectrum of saturated condensate gas at the highest experimental pressure point by the correction coefficient a in the step S3.2 to obtain a new corrected two-dimensional nuclear magnetic resonance $T_1$-$T_2$ spectrum, wherein a new corrected two-dimensional nuclear magnetic resonance $T_1$-$T_2$ spectrum is actually a two-dimensional nuclear magnetic resonance $T_1$-$T_2$ spectrum of pure condensate gas at the certain pressure point, which is shown as follows;

the two-dimensional nuclear magnetic resonance $T_1$-$T_2$ spectrum of the saturated condensate gas at the highest experimental pressure point:

$$\begin{bmatrix} C_{11} & \cdots & C_{1n} \\ \vdots & \ddots & \vdots \\ C_{n1} & \cdots & C_{nn} \end{bmatrix}$$

the two-dimensional nuclear magnetic resonance $T_1$-$T_2$ spectrum of actual condensate gas at the certain pressure point:

$$\begin{bmatrix} D_{11} & \cdots & D_{1n} \\ \vdots & \ddots & \vdots \\ D_{n1} & \cdots & D_{nn} \end{bmatrix}$$

the two-dimensional nuclear magnetic resonance $T_1$-$T_2$ spectrum of the pure condensate gas at the certain pressure point:

$$\begin{bmatrix} aC_{11} & \cdots & aC_{1n} \\ \vdots & \ddots & \vdots \\ aC_{n1} & \cdots & aC_{nn} \end{bmatrix}$$

step S3.4: subtracting the two-dimensional nuclear magnetic resonance $T_1$-$T_2$ spectrum of the pure condensate gas at the certain pressure point obtained in the step S3.3 from the two-dimensional nuclear magnetic resonance $T_1$-$T_2$ spectrum of the actual condensate gas at the certain pressure point in the depletion process, calculating a difference between the two-dimensional nuclear magnetic resonance $T_1$-$T_2$ spectra of the actual condensate gas and the pure condensate gas to obtain a new spectrum, wherein a positive part represents precipitated condensate oil, and a sum of the positive parts is signal intensity occupied by the precipitated condensate oil; and substituting the signal intensity into the relationship curve between the signal intensity and the condensate saturation in the step S1 to obtain condensate saturation at the certain pressure point, which is shown as follows:

the two-dimensional nuclear magnetic resonance $T_1$-$T_2$ spectrum of actual condensate gas at the certain pressure point minus the two-dimensional nuclear magnetic resonance $T_1$-$T_2$ spectrum of pure condensate gas at the certain pressure point:

$$\begin{bmatrix} D_{11} & \cdots & D_{1n} \\ \vdots & \ddots & \vdots \\ D_{n1} & \cdots & D_{nn} \end{bmatrix} - \begin{bmatrix} aC_{11} & \cdots & aC_{1n} \\ \vdots & \ddots & \vdots \\ aC_{n1} & \cdots & aC_{nn} \end{bmatrix} = \begin{bmatrix} D_{11} - aC_{11} & \cdots & D_{1n} - aC_{1n} \\ \vdots & \ddots & \vdots \\ D_{n1} - aD_{n1} & \cdots & D_{nn} - aC_{nn} \end{bmatrix}$$

wherein the signal intensity occupied by the precipitated condensate oil is a sum of all positive numbers in the matrix:

$$\sum_{i=1}^{n}\sum_{j=1}^{n}(D_{ij} - aC_{ij}) \cdot II(D_{ij} - aC_{ij} > 0)$$

wherein i represents a row index, j represents a column index, and the matrix is n×n; $II(D_{ij}-aC_{ij}>0)$ is an indication function, when $D_{ij}-aC_{ij}>0$, the indication function is 1, and otherwise, the indication function is 0; and step S3.5: repeating the step S3.2 to the step S3.4, and calculating signal intensity occupied by condensate oil precipitated at each pressure, thereby obtaining condensate saturation corresponding to each pressure point and finally obtaining a relationship curve between the pressure and the condensate saturation;

step S4: plotting a relationship curve between total signal intensity and pressure by total signal intensity of the one-dimensional nuclear magnetic resonance $T_2$ spectrum and total signal intensity of the two-dimensional nuclear magnetic resonance $T_1$-$T_2$ spectrum obtained in the depletion experiment, and obtaining a pressure point corresponding to a sudden drop point of the relationship curve between the total signal intensity and pressure, wherein the pressure point is a critical condensate saturation pressure point; then calculating critical condensate saturation corresponding to the critical condensate saturation pressure according to a relationship curve between pressure and condensate saturation obtained by an improved difference spectroscopy method; and step S5: verifying the reliability of the critical condensate saturation pressure and the critical condensate saturation by adopting a long rock core depletion experiment and numerical simulation.

2. The method for measuring critical condensate saturation pressure and critical condensate saturation of condensate gas by combining one-dimensional and two-dimensional nuclear magnetic resonance techniques according to claim 1, wherein the step S1 comprises the following specific operation processes:

step S1.1: cleaning and drying the rock core;

step S1.2: soaking the rock core with a condensate oil sample, weighing the rock core to obtain condensate saturation, and then performing two-dimensional nuclear magnetic resonance $T_1$-$T_2$ test on the soaked rock core to obtain a two-dimensional nuclear magnetic resonance $T_1$-$T_2$ spectrum of a rock core sample, that is, obtaining signal intensity of the two-dimensional nuclear magnetic resonance $T_1$-$T_2$ spectrum of the rock core;

step S1.3: changing the condensate saturation by changing a soaking degree of the rock core in the condensate oil, and measuring a corresponding two-dimensional nuclear magnetic resonance $T_1$-$T_2$ spectrum; and step S1.4: obtaining five different saturations in the experiment and measuring two-dimensional nuclear magnetic resonance $T_1$-$T_2$ spectra corresponding to the saturations, and plotting a relationship between the signal intensity and the condensate saturation based on signal intensities of the two-dimensional nuclear magnetic resonance $T_1$-$T_2$ spectra of the five different condensate saturations.

3. The method for measuring critical condensate saturation pressure and critical condensate saturation of condensate gas by combining one-dimensional and two-dimensional nuclear magnetic resonance techniques according to claim 1, wherein the step S2 comprises the following specific operation processes:

step S2.1: cleaning and drying the rock core;

step S2.2: placing the rock core into a nuclear magnetic resonance holder, building internal pressure of the rock core by using pure methane, applying confining pressure higher than the internal pressure of the rock core by using a circulating fluorinated liquid, simultaneously controlling a back pressure pump to apply back pressure higher than the internal pressure of the rock core, starting a circulating heating device, and heating to an experimental temperature; continuously building pressure after the temperature rise is completed, and performing methane two-dimensional nuclear magnetic resonance $T_1$-$T_2$ spectrum test every 3 MPa in the methane pressure building process until the highest experimental pressure is reached;

step S2.3: injecting prepared high-pressure condensate gas into the rock core to displace the methane; injecting 10 PV condensate gas to complete condensate gas saturation, wherein an outlet gas-oil ratio reaches an initial gas-oil ratio, and then completing condensate gas saturation;

step S2.4: reducing the back pressure by controlling the back pressure pump, reducing by 3 MPa each time to simulate the depletion process, synchronously reducing the confining pressure, and performing one-dimensional nuclear magnetic resonance $T_2$ spectrum test and two-dimensional nuclear magnetic resonance $T_1$-$T_2$ spectrum test after each pressure point is stabilized for 2 hours to obtain a one-dimensional nuclear magnetic resonance $T_2$ spectrum and a two-dimensional nuclear magnetic resonance $T_1$-$T_2$ spectrum at each pressure point; and step S2.5: after the experiment is completed, closing the circulating heating device, dismantling experiment pipelines, cleaning experiment devices, and ending the experiment.

4. The method for measuring critical condensate saturation pressure and critical condensate saturation of condensate gas by combining one-dimensional and two-dimensional nuclear magnetic resonance techniques according to claim 3, wherein, in the step S2.2, the circulating fluorinated liquid applies confining pressure that is 3 MPa higher than the internal pressure of the rock core.

5. The method for measuring critical condensate saturation pressure and critical condensate saturation of condensate gas by combining one-dimensional and two-dimensional nuclear magnetic resonance techniques according to claim 4, wherein, in the step S2.2, the back pressure is ensured to be 2 MPa higher than the internal pressure of the rock core in the pressure building process.

6. The method for measuring critical condensate saturation pressure and critical condensate saturation of condensate gas by combining one-dimensional and two-dimensional nuclear magnetic resonance techniques according to claim 1, wherein the step S5 comprises the following specific operation processes:
- step S5.1: filling a rock core into a long rock core holder, and displacing methane by using condensate gas after pressure building is completed by using methane to establish reservoir conditions;
- step S5.2: gradually reducing the pressure at a certain speed, and observing the phenomenon in a high-pressure visual window;
- step S5.3: when a first drop of oil appears in the visual window, taking condensate saturation in the corresponding rock core as critical condensate saturation, and recording an outlet pressure P0 of the corresponding long rock core holder; and
- step S5.4: establishing a long rock core numerical simulation model based on physical property parameters of a long rock core, simulating a long rock core depletion experiment process, and finally determining critical condensate saturation of the condensate gas in the long rock core depletion experiment process according to the critical condensate saturation pressure P0 determined by the long rock core experiment.

* * * * *